(12) United States Patent
Zhang

(10) Patent No.: US 7,855,373 B2
(45) Date of Patent: Dec. 21, 2010

(54) CHARGED PARTICLE GUN

(75) Inventor: Tao Zhang, Cambridge (GB)

(73) Assignee: Nanobeam Limited, Cambridge (GB)

( * ) Notice: Subject to any disclaimer, the term of this patent is extended or adjusted under 35 U.S.C. 154(b) by 546 days.

(21) Appl. No.: 11/628,195

(22) PCT Filed: May 13, 2005

(86) PCT No.: PCT/GB2005/050063

§ 371 (c)(1),
(2), (4) Date: Feb. 4, 2008

(87) PCT Pub. No.: WO2005/119723

PCT Pub. Date: Dec. 15, 2005

(65) Prior Publication Data

US 2008/0251736 A1      Oct. 16, 2008

(30) Foreign Application Priority Data

Jun. 3, 2004   (GB) ................... 0412426.9

(51) Int. Cl.
*G01F 23/00* (2006.01)
*G21K 5/08* (2006.01)
*G21K 5/10* (2006.01)

(52) U.S. Cl. .............. 250/423 R; 250/396 R; 250/307; 250/310; 250/311; 250/440.11; 313/338; 313/451; 313/304; 313/348; 313/268; 313/270

(58) Field of Classification Search ............ 250/440.11, 250/396 R, 307, 310, 311; 313/338, 451, 313/304, 348, 268, 270
See application file for complete search history.

(56) References Cited

U.S. PATENT DOCUMENTS

| | | | |
|---|---|---|---|
| 3,128,407 | A | 4/1964 | Mattson |
| 3,967,150 | A | 6/1976 | Lien et al. |
| 4,082,937 | A | 4/1978 | Istomin et al. |
| 5,117,085 | A | 5/1992 | Fritz et al. |

FOREIGN PATENT DOCUMENTS

| | | | |
|---|---|---|---|
| EP | 0 384 684 | | 8/1990 |
| EP | 0 790 633 | | 8/1997 |
| EP | 1 067 572 | | 1/2001 |
| EP | 1067572 | * | 1/2001 |
| JP | 55-151738 | | 11/1980 |
| JP | 9-17365 | | 1/1997 |

* cited by examiner

*Primary Examiner*—Robert Kim
*Assistant Examiner*—Meenakshi S Sahu

(57) ABSTRACT

An electron gun (1) includes an emitter (2), a tubular support (3) and an adaptor (4) for receiving the emitter. The adaptor includes a tapered plugging surface (7) and the tubular support includes a correspondingly tapered seating surface (9) for receiving the plugging surface. The plugging surface and seating surface have conical profiles which help to position the adaptor concentrically with the support.

21 Claims, 4 Drawing Sheets

CHARGED PARTICLE GUN

CROSS REFERENCE TO RELATED APPLICATION

This application is the U.S. National Stage of International Application Number PCT/GB2005/050063 filed 13 May 2005 and claiming priority from Great Britain Application 0412426 filed 3 Jun. 2004.

FIELD OF THE INVENTION

The present invention relates to charged particle gun, particularly, but not exclusively an electron gun for use in an electron beam lithography system.

BACKGROUND ART

A cold field emission electron gun or a thermal field emission electron gun typically comprises a tip having a radius of about 1 µm or less and an electrode with an aperture having a diameter of about 300-700 µM. If a high enough bias is applied between the tip and the electrode, then a sufficiently high electric field is generated at the tip to extract electrons from it to produce an electron beam.

The tip and the aperture need to be carefully laterally aligned and vertically spaced apart. If they are not properly aligned, the resulting electron beam can suffer from aberration and be misaligned with the optical axis. If they are not properly spaced, then extraction will not occur at workable voltages.

The tip is provided in a unit called an emitter which can be obtained commercially or made in-house. Most commercially available emitters, such as those from FEI Company (TM), USA and Denka (TM), Japan, have a cylindrical housing and the tip protrudes through an aperture located in the center of an end face of the housing.

The electron gun is constructed from an emitter and an electrode. The emitter and the electrode can be aligned before they are assembled into an electron beam system or aligned in-situ in an assembled electron beam system.

Where the emitter and the electrode are aligned before they are assembled into an electron beam system, the emitter is mounted on a moveable stage over the electrode. A skilled technician aligns the emitter with the aperture with the aid of a microscope. Once the technician is satisfied that the tip of the emitter and the aperture are aligned, he or she secures the emitter and the electrode in a support. The stage can then be removed.

Where the emitter and the electrode are aligned in-situ in the electron beam system, the emitter is mounted on a moveable stage. The emitter and aperture are aligned by moving the emitter and monitoring the beam.

Both types of gun take an appreciable amount of time and skill to align. Furthermore, where the emitter and the electrode are aligned in-situ, the movable stage forms part of the gun system, thus increasing its complexity.

The present invention seeks to provide a charged particle gun.

SUMMARY OF THE INVENTION

According to the present invention there is provided a charged particle gun comprising an emitter, an adaptor for receiving the emitter, the adaptor having a frusto-conically shaped plugging surface and a support, the support having a corresponding frusto-conically shaped seating surface, wherein the adaptor receives the emitter and, when the support receives the adaptor, the plugging surface mates with the seating surface.

The emitter may be inserted into the adaptor and may protrude from an open end of the adaptor. When the support receives the adaptor, an inner surface of the adaptor may grip an outer surface of the emitter. The plugging surface may be an outer surface of the adaptor and the seating surface may be an inner surface of the support. The emitter may sit in a luminal region of the support. The support may be tubular. The adaptor may be slotted.

The gun may comprise an electrode. The electrode may be an extractor. The electrode may have an aperture, wherein the aperture and the support are concentric. The electrode may be received in the support.

The gun may comprise an electrode and another adaptor for receiving the electrode, wherein the electrode may have a frusto-conically shaped plugging surface, the adaptor may have a corresponding frusto-conically shaped seating surface and a frusto-conically shaped plugging surface, and the support may have another frusto-conically shaped seating surface and when the other adaptor receives the electrode, the plugging surface mates with the seating surface and when the support receives the electrode, the plugging surface mates with the other seating surface.

The plugging surface of the electrode may be an outer surface of the electrode and the seating surface of the other adaptor may be an inner surface of the other adaptor. The plugging surface of the other adaptor may be an outer surface of the other adaptor and the seating surface of the support may be an inner surface of the support. The electrode may sit in a luminal region of the support. One frusto-conically shaped seating surface of the support may be inverted with respect to the other. The frusto-conically shaped seating surfaces of the support may be concentric. The adaptor may be formed from a material having a greater coefficient of thermal expansion than the support and/or the emitter.

The frusto-conically shaped plugging surface of said adaptor may be slotted to provide finger portions. The finger portions may comprise respective weak joints, which permit the finger portions to move resiliently inwardly or outwardly.

According to the present invention there is also provided a charged particle beam gun comprising an emitter, an adaptor for receiving said emitter, said adaptor having a first mating surface and a support, said support having a corresponding mating surface, wherein said adaptor receives said emitter and, when said support receives said adaptor, said surfaces mate.

The surface may be tapered and may be frusto-conically shaped.

BRIEF DESCRIPTION OF THE DRAWINGS

An embodiment of the present invention will now be described, by way of example, with reference to the accompanying drawings in which.

DETAILED DESCRIPTION OF THE INVENTION

Electron Gun 1

Figure 1:
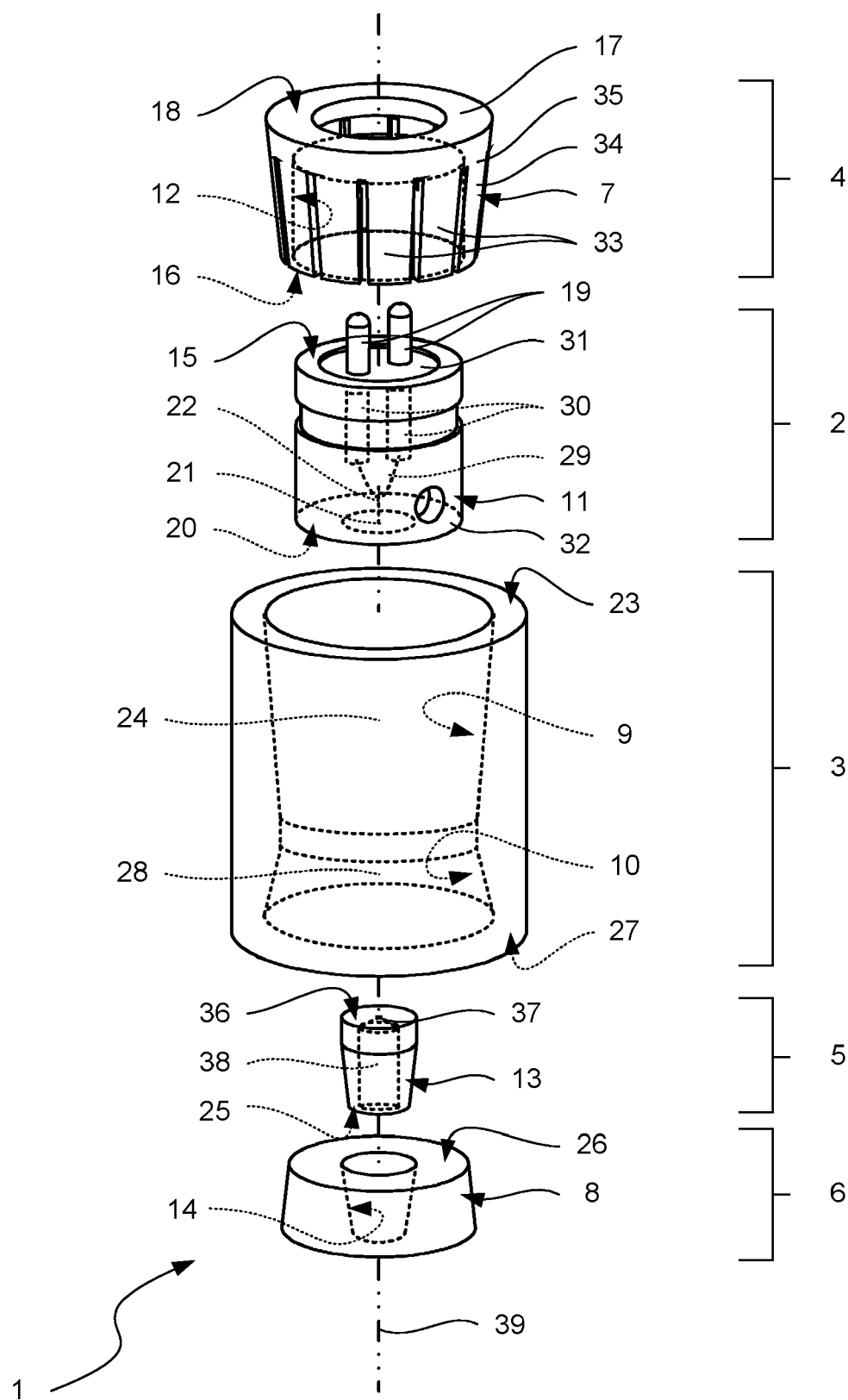
FIG. 1 is an exploded perspective view of an embodiment of an electron gun according to the present invention.
Figure 2:
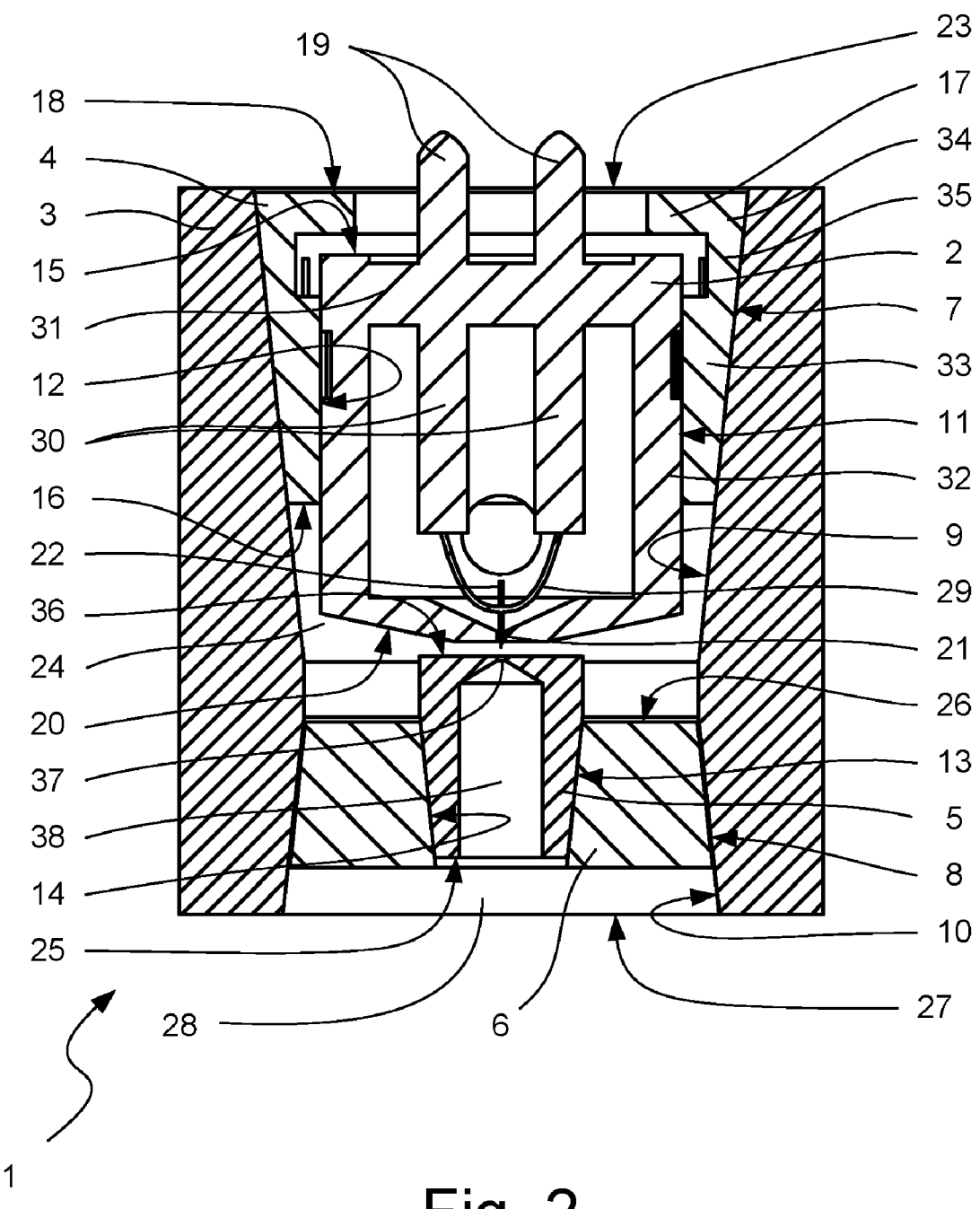
FIG. 2 is a longitudinal cross-sectional view of the assembled electron gun shown in FIG. 1.

Referring to FIGS. 1 and 2, an embodiment of an electron gun 1 according to the present invention is shown. The electron gun 1 is a thermal field emission electron gun and comprises an emitter 2, a support 3, a first adaptor 4, an electrode 5 for extracting electrons and a second adaptor 6.

The first and second adaptors 4, 6 each serve as a plug and have respective plugging surfaces 7, 8. The support 3 is generally tubular and provides a pair of seats in the form of first and second seating surfaces 9, 10 for receiving the first and second adaptors 4, 6 respectively.

The emitter 2 serves as an insert having an outer surface 11 and the first adaptor 4 provides a slot in the form of an inner surface 12 for receiving the emitter 2.

The electrode 5 serves as a plug and has a plugging surface 13. The second adaptor 6 provides a seat in the form of a seating surface 14 for receiving the electrode 5.

A first end 15 of the emitter 2 is inserted into the first adaptor 4 via a first open end 16 (in this case a bottom end) of the adaptor 4. An inwardly radiating flange 17 is provided at a second open end 18 of the adaptor 4. The emitter 2 protrudes from the first open end 16 of the adaptor 4. As will be explained in more detail later the emitter 2 is gripped by the inner surface 12 of the adaptor 4, although it may also be secured by one or more screws (not shown).

Terminals 19 extend from the first end 15 of the emitter 2 through the second open end 17 of the adaptor 4. A second end 20 of the emitter 2 is frusto-conically shaped and has a central aperture 21 through which a tip 22 protrudes. The tip 22 is the source for an electron beam (not shown).

The first adaptor 4, together with the emitter 2, is inserted into the support 3 via a first open end 23 of the support 3 (in this case a top end) until the plugging surface 7 mates with the first seating surface 9.

The plugging surface 7 of the first adaptor 4 is frusto-conically shaped. Likewise, the first seating surface 9 of the support 3 is also frusto-conically shaped. Thus, when inserted into the support 3, the first adaptor 4 sits in a first luminal region 24 of the support 3.

The plugging and seating surfaces 7, 9 have conical profiles which help to position the first adaptor 4 concentrically with the support 3.

Furthermore, the emitter 2 can be arranged to be at a given position (in this case at a given height) relative to the electrode 5. A process of spacing the emitter 2 from the electrode 5 will be described in more detail later.

A first end 25 of the electrode 5 (in this case a bottom end which will be facing downstream, away from the emitter) is inserted into the second adaptor 6 via a first end 26 of the second adaptor 6 (i.e. a top end, facing towards the emitter) until the plugging surface 13 of the electrode 5 mates with the seating surface 14 of the adaptor 6. The first end 26 of the adaptor 6 is inserted into the support 3 via a second open end 27 of the support 3 (in this case a bottom or downstream end) until the plugging surface 8 mates with the second seating surface 10 of the support 3.

The plugging surface 8 of the second adaptor 6 is frusto-conically shaped. Likewise, the second seating surface 10 of the support 3 is also frusto-conically shaped, inverted with respect to the first seating surface 9 of the support 3. Thus, when inserted, the second adaptor 6 rests in a second luminal region 28 of the support 3.

The first and second seating surfaces 9, 10 are arranged concentrically in the support 3. Thus, when assembled in the support 3 using the adaptors 4, 6, the emitter 2 and the aperture 5 are also arranged concentrically. Furthermore, the gun 1 can be partly assembled by placing the electrode 5 in the second adaptor 6 and inserting the second adaptor 6 into the support. If the dimensions of the partly-assembled gun are measured, then the first adaptor 4 can be configured so that the emitter 2 and the aperture 5 are separated by given spacing.

In this example, conical profiles are used since surfaces can be easily and precisely machined with minimal transverse section eccentricity and uniform longitudinal taper. However, other circularly symmetric profiles may be used, such as parabolic or hemispherical profiles. Alternatively, other rotationally symmetric profiles may be used, such as polygonal-based pyramidal profiles. Furthermore, profiles may be stepped.

In the emitter 2, the tip 22 has a radius of less than 1 μm. The tip 22 comprises tungsten and is welded onto a filament 29 comprising a tungsten hairpin. The filament 29 is mounted to a pair of electrically conductive posts 30 held in an electrically insulating base 31 which in turn is fixed in housing 32. The housing 32 has a cylindrical outer surface, namely surface 11. The housing 32 is formed of a hard, electrically conductive material, such as molybdenum. As described earlier, the second end 20 of the emitter is frusto-conically shaped and serves as a suppressor cap. The second end 20 has a central aperture 21 having a diameter of about 300-700 μm, concentric with the cylindrical aligning surface 11, through which the tip 22 protrudes. The emitter has a length of 19 mm and a diameter of 17 mm. The emitter 2 is a thermal field emission emitter and can be commercially obtained from FEI Company (TM), USA or Denka (TM), Japan. However, the emitter 2 may provide a cold field emission emitter.

The support 3 is formed from an electrically insulating material, such as alumina. However other ceramics may be used. Alternatively, the support may be formed from an electrically conducting material, such molybdenum. The support 3 is 35 mm long and about 31 mm wide.

The first adaptor 4 is longitudinally slotted from the first end 16 towards the second end 18 so as to define longitudinal finger portions 33 which depend from a ring portion 34. The finger portions 33 are each provided with a weak joint 35, which permits the finger portions 33 to move or hinge resiliently inwardly or outwardly. The diameter of the inner surface 12 corresponds to a measured diameter of the housing 32 of the emitter 2 and in this case equals the diameter of the housing 32. The first adaptor 4 is formed from a hard, electrically conducting material, such molybdenum. However, it may be formed from a hard, electrically insulating material, such as a ceramic. The first adaptor 4 is 14 mm long.

Alternatively, if the housing 32 of the emitter 2 and the adaptor 4 are formed from different materials then, allowing for different coefficients of thermal expansion, the diameter of the surface 12 may be arranged to be larger than the diameter at the housing 32 at a first relatively low temperature, for example room temperature, but substantially equal at a relatively second relatively high temperature, for example its expected, modelled or measured operating temperature.

The electrode 5 includes a closed end face 36 having a central aperture 37, and a cavity 38. The aperture 37 has a diameter of about 10 μm and is concentric with the plugging surface 12. The electrode 5 is formed from an electrically conducting material, such molybdenum. The electrode 5 has a length of 10 mm and a diameter of 8 mm.

The aim of alignment is to line up the tip 22 and the center of the aperture 36 along a common "optical" axis 39. Thus, in use, the electron beam (not shown) travels along the optical axis 39 through the aperture 37 into the cavity 38 and through the end 25 of the electrode 5 to the rest of the electron beam system (not shown).

The second adaptor 6 is formed from an electrically conducting material, such as molybdenum or titanium. However, it may be formed from a hard, electrically insulating material. The adaptor has a length of 7 mm.

As described earlier, the second adaptor 6 receives the electrode 5 and in turn serves as a plug for being received in the support 3. Nevertheless, the electrode 5 and the support 3 may be configured such that the electrode 5 is received by the support 3, without the second adaptor 6.

Assembly

The electron gun 1 is assembled in three stages. Firstly, the electron gun 1 is partially assembled by inserting the electrode 5 into the second adaptor 6 and the second adaptor 6 into the support 3. Secondly, to provide the correct spacing between the face 20 of the emitter and the face of the electrode 35, the partially assembled gun is measured or calibrated, optionally using a test emitter of known dimensions. Thirdly, the emitter 2 is inserted into the first adaptor 4 and the first adaptor 4 is inserted into the support 3.

Calibration simplifies spacing. Even though the emitter 2 may be replaced with another emitter of a different diameter, variations in the diameter can be accommodated using calibration factors.

Partial Assembly

Figure 3:
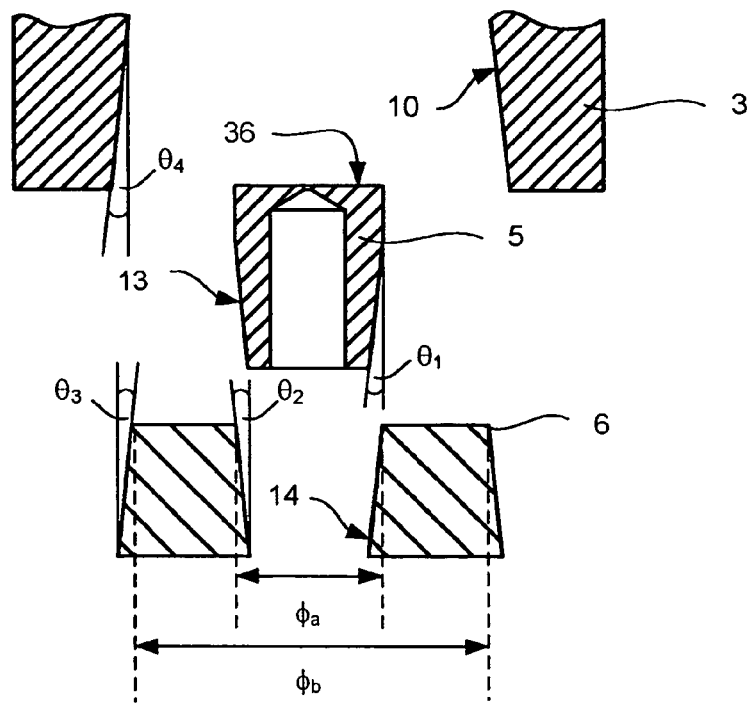
FIG. 3 is a cross-sectional view of a lower portion of a support, an adaptor and an electrode shown in FIG. 1.

Referring to FIG. 3, slopes $\theta_1$, $\theta_2$ of the plugging and seating surfaces 13, 14 of the electrode 5 and second adaptor 6 are arranged to be the substantially the same.

Likewise, slopes $\theta_3$, $\theta_4$ of the plugging and seating surfaces 8, 10 of the second adaptor 6 and support 3 are arranged to be the substantially the same.

The maximum diameter $\phi_a$ of the seating surface 14 and a minimum diameter $\phi_b$ of the plugging surface 8 of the second adaptor 6 are arranged so that the closed end face 36 of the electrode 5 sits at a given position (in this case at a given height) or within a given range of positions (heights). To achieve the same result, a minimum diameter of the plugging surface 13 of the first electrode and/or a maximum diameter of the seating surface 10 of the support 3 may be arranged.

The electron gun 1 is partially assembled by inserting the electrode 5 into the second adaptor 6 and the second adaptor 6 into the support 3.

Measurement/Calibration of Partially Assembled Gun

Figure 4:
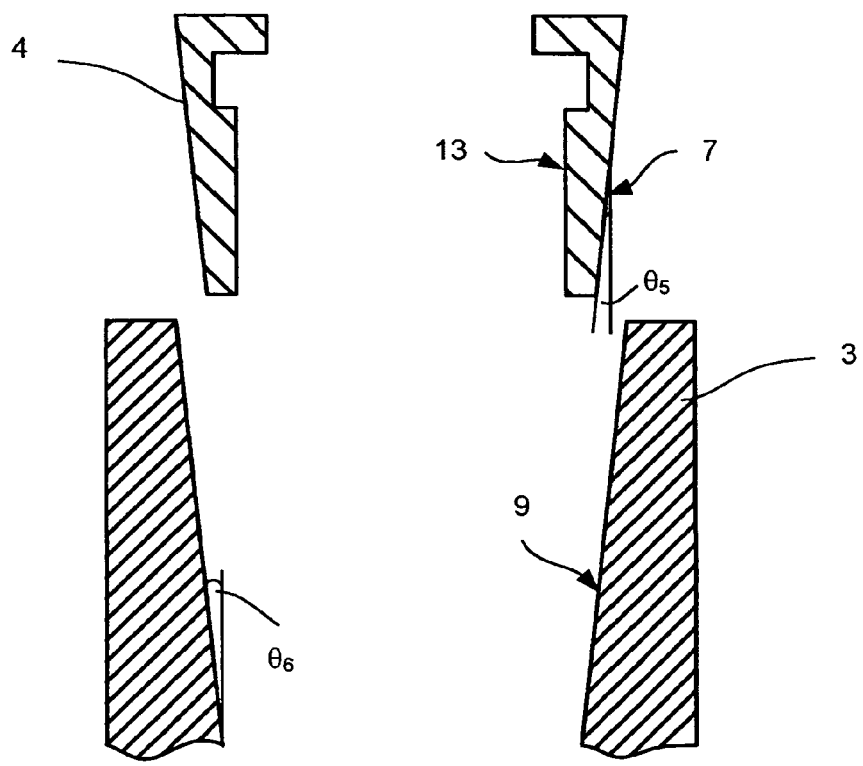
FIG. 4 is a cross-sectional view of an upper portion of a support, an adaptor and an emitter shown in FIG. 1.

Referring to FIG. 4, slopes $\theta_5$, $\theta_6$ of the plugging and seating surfaces 7, 9 of the first adaptor 4 and the support 3 are arranged to be the substantially the same.

Figure 5:
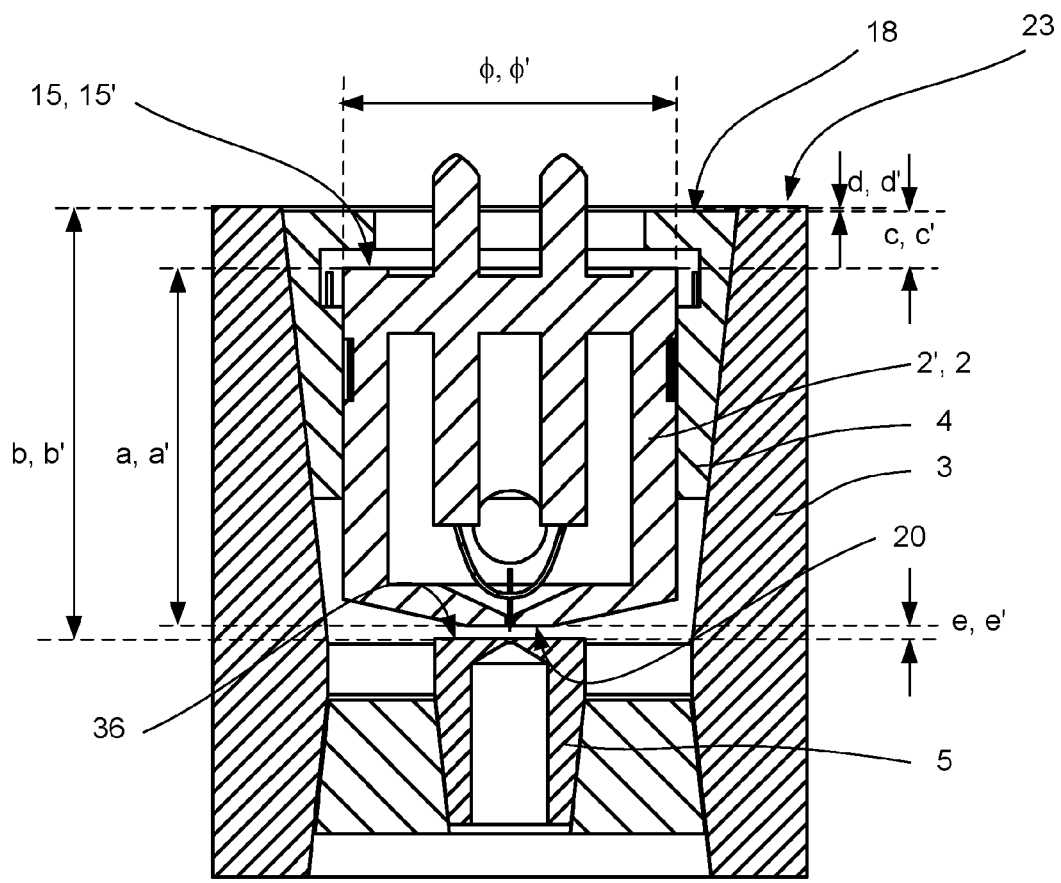
FIG. 5 illustrates measurements taken to determine a spacing between an emitter and an electrode.

Referring to FIG. 5, a process of calibration using a test emitter 2' can be performed.

A length, a, and a diameter, $\phi$, of the test emitter 2' are measured. A length, b, between the face 36 of the electrode 5 and the open end 23 of the support 3 is measured.

The test emitter 2' is inserted into the first adaptor 4 and the first adaptor 4 is placed into the support 3.

A length, c, between a first end 15' of the emitter 2' and the end 18 of the adaptor 4 is measured. A length, d, between the end 18 of the adaptor 4 and the open end 23 of the support 3 is measured.

Thus, a length, e, between the face 36 of the electrode 5 and a second end of the emitter 2' can be determined using the relationship:

$$e=b-(a+c+d) \quad (1)$$

Equation (1) above can be rearranged to give c:

$$c=b-(a+d+e) \quad (1')$$

The length e can be set to a desired value L, for example 600 µm, and so derive a value for c, i.e. c=M. Thus, if the test emitter 2' is arranged such that c=M, then e=L=600 µm.

Figure 6:
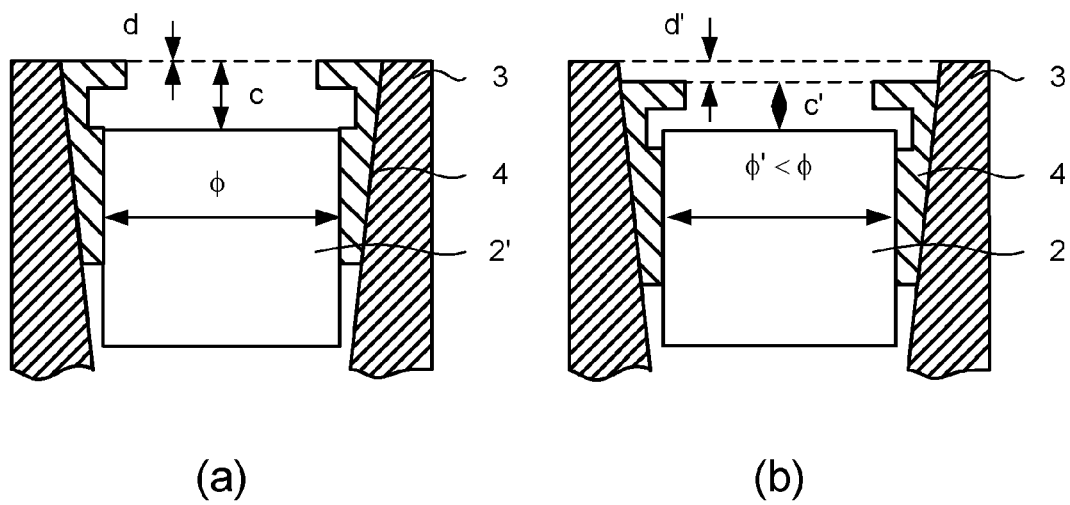
FIGS. 6a and 6b illustrate a variation in seating height with a variation in width of an emitter.

Referring to FIGS. 6a and 6b, the emitter 2 may have a diameter $\phi'$ which is different from the diameter $\phi$ of the test emitter 2'. Nevertheless, the adaptor 4 can accommodate the emitter 2 having a different diameter. This can be achieved if the finger portions 33 of the adaptor 4 can move inwardly or outwardly. If the finger portions 33 of the adaptor move, for example inwardly, to hold the emitter 2 having a smaller diameter $\phi'<\phi$, then the adaptor 4 has a different diameter. Thus, the adaptor 4 sits at different height, in this example, lower with respect to the support 3. To compensate, the length, between the first end 15 of the emitter 2 and the end 18 of the adaptor 4 can be changed.

To compensate for variations in diameter, a calibration factor k may be determined for a given value of e, for example e=M=600 µm, either theoretically as a function of the slope, $\theta$, of the plugging and seating surfaces 7, 9, i.e. $\theta=\theta_5=\theta_6$, or empirically by measuring lengths a, b and d for at least two emitters, each having a different diameter $\phi$.

Thus, a value of c* which will yield e=M can be determined using:

$$c^*=k\phi' \quad (2)$$

Thus, once the calibration factor k has been found, the emitter 2 may be accommodated by measuring its length a' and its diameter $\phi'$ and adjusting c' such that c'=c* so that, when assembled, the emitter 2 and the electrode 5 are spaced with e'=e=M=600 µm.

It will be appreciated that dimensions a, b, d' may be measured for the emitter 2, without determining a calibration factor k, and thus directly derive a value for c' using Equation 1' above (with a=a, b=b', c=c, d=d' and e=e') for ensuring that the emitter 2 and the electrode 5 are separated by a given spacing e'=M, for example M=600 µm.

Completing Assembly

Assembly of the electron gun 1 is completed by inserting the emitter 2 into the first adaptor 4, adjusting c' as determined by any of the methods described earlier so to achieve a desired gap size e'=M and by inserting the first adaptor 4 into the support 3. To ensure c' is fixed, the emitter 2 and the adaptor 4 can be secured using one or more screws or held in place during insertion of the adaptor 4 into the support 3.

It will be appreciated that if height adjustment is not required, then a rigid adaptor may be used.

It will be appreciated that many modifications may be made to the embodiment hereinbefore described. For example, the electrode may be an anode. The charged particle gun may be a thermionic emission electron gun. The charged particle gun may be an ion gun.

The invention claimed is:

1. A charged particle gun comprising:
   an emitter;
   an adaptor for receiving said emitter, said adaptor having a frusto-conically shaped plugging surface which is slotted to provide finger portions which comprise weak joints and which permit the finger portion to move resiliently inwardly and outwardly and a support, said support having a corresponding frusto-conically shaped seating surface;

wherein said adaptor receives said emitter and, when said support receives said adaptor, said plugging surface mates with said seating surface.

2. A gun according to claim 1, wherein said emitter is inserted into said adaptor.

3. A gun according to claim 1, wherein said emitter protrudes from an open end of said adaptor.

4. A gun according to claim 1, wherein when said support receives said adaptor, an inner surface of said adaptor grips an outer surface of said emitter.

5. A gun according to claim 1, wherein said plugging surface is an outer surface of said adaptor and said seating surface is an inner surface of said support.

6. A gun according to claim 1, wherein said emitter sits in a luminal region of said support.

7. A gun according to claim 1, wherein said support is tubular.

8. A gun according to claim 1, comprising an electrode.

9. A gun according to claim 1, comprising an electrode having an aperture, wherein said aperture and said support are concentric.

10. A gun according to claim 1, comprising an electrode received in said support.

11. A gun according to claim 1, comprising:
an electrode; and
another adaptor for receiving said electrode,
wherein said electrode has a frusto-conically shaped plugging surface, said other adaptor has a corresponding frusto-conically shaped seating surface and a frusto-conically shaped plugging surface, and said support has another frusto-conically shaped seating surface and when said other adaptor receives said electrode, said other plugging surface mates with said corresponding seating surface and when said support receives said electrode, said other plugging surface mates with said other seating surface.

12. A gun according to claim 11, wherein said plugging surface of said electrode is an outer surface of said electrode and said seating surface of said other adaptor is an inner surface of said other adaptor.

13. A gun according to claim 11, wherein said plugging surface of said other adaptor is an outer surface of said other adaptor and said seating surface of said support is an inner surface of said support.

14. A gun according to claim 11, wherein said electrode sits in a luminal region of said support.

15. A gun according to claim 11, wherein one frusto-conically shaped seating surface of said support is inverted with respect to the other.

16. A gun according to claim 1, wherein said frusto-conically shaped seating surfaces of said support are concentric.

17. A gun according to claim 1, wherein said adaptor is formed from a material having a greater coefficient of thermal expansion than the support the emitter, or both.

18. A charged particle gun comprising:
an emitter;
an adaptor for receiving said emitter, said adaptor having a first mating surface which is slotted to provide finger portions, which comprise weak joints and which permit the finger portion to move resiliently inwardly and outwardly; and
a support, said support having a corresponding mating surface;
wherein said adaptor receives said emitter and, when said support receives said adaptor, said surfaces mate.

19. A gun according to claim 18, wherein said surfaces are tapered.

20. A gun according to claim 18, wherein said surfaces are frusto-conically shaped.

21. A charged particle gun comprising:
an emitter;
an adaptor for receiving said emitter, said adaptor having a frusto-conically shaped plugging surface; and
a support, said support having a corresponding frusto-conically shaped seating surface;
wherein said adaptor receives said emitter and, when said support receives said adaptor, said plugging surface mates with said seating surface, said gun further comprising:
an electrode; and
another adaptor for receiving said electrode,
wherein said electrode has a frusto-conically shaped plugging surface, said other adaptor has a corresponding frusto-conically shaped seating surface and a frusto-conically shaped plugging surface, and said support has another frusto-conically shaped seating surface and when said other adaptor receives said electrode, said other plugging surface mates with said corresponding seating surface and when said support receives said electrode, said other plugging surface mates with said other seating surface.

* * * * *